United States Patent
La Rosa

(10) Patent No.: US 11,169,556 B2
(45) Date of Patent: Nov. 9, 2021

(54) POWER TRACKING CIRCUIT, CORRESPONDING SYSTEM AND METHOD

(71) Applicant: STMicroelectronics S.r.l., Agrate Brianza (IT)

(72) Inventor: Roberto La Rosa, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 288 days.

(21) Appl. No.: 16/283,067

(22) Filed: Feb. 22, 2019

(65) Prior Publication Data

US 2019/0265742 A1    Aug. 29, 2019

(30) Foreign Application Priority Data

Feb. 28, 2018  (IT) .................. 102018000003122

(51) Int. Cl.
| | |
|---|---|
| G05F 1/67 | (2006.01) |
| H02N 2/18 | (2006.01) |
| H01L 35/00 | (2006.01) |
| H02J 1/10 | (2006.01) |
| H02J 3/38 | (2006.01) |
| H02M 3/24 | (2006.01) |

(52) U.S. Cl.
CPC ............... *G05F 1/67* (2013.01); *H01L 35/00* (2013.01); *H02J 1/10* (2013.01); *H02J 3/381* (2013.01); *H02J 3/385* (2013.01); *H02M 3/24* (2013.01); *H02N 2/18* (2013.01); *H02J 2300/26* (2020.01); *Y02E 10/56* (2013.01)

(58) Field of Classification Search
CPC ...... H02J 7/35; H02J 1/10; H02J 3/381; H02J 2300/26; H02J 3/385; G05F 1/67; H02N 2/18; H01L 35/00; H02M 3/24; Y02E 10/56

USPC ................... 307/151, 82; 323/304; 136/293; 363/95, 97, 98
See application file for complete search history.

(56) References Cited

U.S. PATENT DOCUMENTS

| | | |
|---|---|---|
| 3,696,286 A | 10/1972 | Ule |
| 5,001,415 A | 3/1991 | Watkinson |
| 5,235,266 A | 8/1993 | Schaffrin |
| 9,154,032 B1 * | 10/2015 | Beijer .................. H02M 3/156 |

(Continued)

OTHER PUBLICATIONS

IT Search Report and Written Opinion for IT Appl. No. 102018000003122 dated Sep. 28, 2018 (8 pages).

*Primary Examiner* — Arnold M Kinkead
(74) *Attorney, Agent, or Firm* — Gardere Wynne Sewell LLP

(57) ABSTRACT

A first generator produces a first signal that is supplied to an energy storage circuit. Energy transfer circuitry coupled to the energy storage circuit transfers energy stored in the energy storage circuit to an output node. A driver circuit coupled to the energy transfer circuitry switches the energy transfer circuitry between a state where energy from the first signal is stored in the energy storage circuit and a state where energy stored in the energy storage circuit section is delivered to the output node. A voltage at the energy storage circuit varies between an upper value and a lower value around a voltage setting point. A second generator, which is a scaled-down replica of the first generator, produces a second signal that is indicative of an open-circuit voltage of the first generator. The driver circuit uses the second signal to set the voltage setting point.

22 Claims, 2 Drawing Sheets

(56) References Cited

U.S. PATENT DOCUMENTS

| | | | |
|---|---|---|---|
| 2007/0029881 A1 | 2/2007 | Lai | |
| 2009/0179500 A1* | 7/2009 | Ragonese | H02J 3/381 |
| | | | 307/82 |
| 2016/0329718 A1* | 11/2016 | Sawyers | H02M 7/04 |
| 2018/0316191 A1* | 11/2018 | Zhu | H02J 3/383 |

* cited by examiner

POWER TRACKING CIRCUIT, CORRESPONDING SYSTEM AND METHOD

PRIORITY CLAIM

This application claims the priority benefit of Italian Application for Patent No. 102018000003122, filed on Feb. 28, 2018, the content of which is hereby incorporated by reference in its entirety to the maximum extent allowable by law.

TECHNICAL FIELD

The description relates to power tracking circuits.

One or more embodiments may be applied, e.g. in photovoltaic (PV) systems.

BACKGROUND

The capability of effectively tracking the (electrical) power available in a system may be helpful in meeting the increasing demand for, e.g., wireless sensor networks (WSNs) capable of collecting and sharing data in wireless operation while oftentimes positioned in places which are hard to reach and service.

An increasing demand thus exists for energy harvesting solutions which may facilitate implementing battery-free and/or set-and-forget sensor nodes, which in turn facilitates the production of devices adapted to be virtually ubiquitous and inherently maintenance-free, e.g., for IoT (Internet of Things) applications.

In the exemplary case of photovoltaic generation systems, the power delivered by a PV (photovoltaic) system may depend on various factors such as, e.g., irradiance, temperature and the current drawn from the cells.

Techniques referred to as MPPT (Maximum Power Point Tracking) can be used to determine the maximum power available from these systems.

The power from such a system can be increased (maximized) by resorting to various approaches ranging from using simple voltage relationships to adopting more complex analysis based on collecting multiple samples.

Irrespective of the approach adopted, increasing the efficiency of power transfer while reducing the amount of power taken by the system itself to perform MPPT functions is a desirable target to achieve.

In (ultra) low-power applications, such as a battery-free solar harvester sensor nodes, the level of power to be transferred may be so low that providing MPPT circuitry efficient enough to make MPPT itself worthwhile may represent a challenge for the designer.

There is accordingly a need in the art is to contribute in overcoming the critical issues discussed in the foregoing.

SUMMARY

One or more embodiments may relate to a corresponding system (e.g., a IoT node equipped with a photovoltaic generation system).

One or more embodiments may relate to a corresponding method.

The claims are an integral part of the technical disclosure of one or more embodiments as provided herein.

One or more embodiments may use a three-terminal (e.g., PV) cell (Vplus, Vminus and Voc), where Voc is derived from a small "dummy" cell configured to reproduce the behavior of the "main" system with the dummy cell capable of providing, e.g., a measure of the open circuit voltage of the main system which in turn can be used to perform a MPPT function.

One or more embodiments may be based on the recognition of the fact that possible disadvantages related to the presence of an extra pin and to a (small) part of the system area being used for measurement purposes, rather than for energy production, may be compensated by various advantages including the simplification of the circuit architecture associated to MPPT functions (e.g. pre-regulation of a DC-DC converter) and the reduction of the power absorption, so that MPPT may become attractive also for (ultra) low-power systems, e.g. in the µW range.

One or more embodiments facilitate reducing current absorption associated with MPPT functions such (as MPPT voltage pre-conditioning) to a value in the range of units of nA.

One or more embodiments may provide one or more of the following advantages:
  increased ("optimized") energy efficiency,
  system miniaturization, e.g., with reduced dimensions of the associated harvester,
  system flexibility, with the capability, e.g., in the case of PV systems, of adapting to indoor and outdoor light conditions while preserving substantially identical energy performance.

In an embodiment, a circuit comprises: a first generator configured to produce a first signal; an energy storage circuit coupled to the first generator and supplied with the first signal; energy transfer circuitry coupled to the energy storage circuit and configured to transfer towards an output node energy stored in the energy storage circuit; driver circuitry coupled to the energy transfer circuitry, the driver circuitry configured to controllably switch the energy transfer circuitry between an energy storage state of the first signal from the first generator in the energy storage circuit section and an energy transfer state of the energy stored in the energy storage circuit section towards the output node, the voltage at the energy storage circuit alternatively variable between an upper value and a lower value around a voltage setting point; and a second generator comprising a down-scaled replica of the first generator, the second generator configured to produce a second signal indicative of the open-circuit voltage of the first generator, the second generator coupled to the driver circuitry of the energy transfer circuitry, wherein the driver circuitry of the energy transfer circuitry is sensitive to the second signal from the second generator, with said voltage setting point set as a function of the second signal from the second generator indicative of the open-circuit voltage of the first generator.

One or more embodiments may comprise a voltage divider coupled to the second generator and to the driver circuitry of the energy transfer circuitry with an output voltage from the voltage divider coupled to the driver circuitry of the energy transfer circuitry.

In one or more embodiments, the driver circuitry of the energy transfer circuitry may comprise a comparator coupled to the energy storage circuit and to the second generator, the comparator sensitive to the voltage at the energy storage circuit section and to the second signal from the second generator.

In one or more embodiments, the comparator may comprise a hysteresis comparator configured to change state at an upper end and a lower end of a hysteresis interval around said voltage setting point.

In one or more embodiments, the second generator may comprise a down-scaled replica of the first generator with a scaling factor of at least 10, optionally at least 100.

In one or more embodiments, the first and the second generator may comprise photovoltaic generators.

In an embodiment, a system comprises: at least one circuit as noted above; and an electrical load coupled to the output node of the circuit to be supplied thereby.

In an embodiment, a method comprises: producing a first signal via a first generator; providing an energy storage circuit coupled to the first generator and supplied with the first signal therefrom; transferring energy stored in the energy storage circuit towards an output node via energy transfer circuitry controllably switched between an energy storage state of the first signal from the first generator in the energy storage circuit section and an energy transfer state of the energy stored in the energy storage circuit towards the output node, wherein the voltage at the energy storage circuit alternatively varies between an upper value and a lower value around a voltage setting point; producing a second signal via a second generator comprising a down-scaled replica of the first generator, the second signal indicative of the open-circuit voltage of the first generator; and setting said voltage setting point as a function of the second signal from the second generator indicative of the open-circuit voltage of the first generator.

BRIEF DESCRIPTION OF THE DRAWINGS

One or more embodiments will now be described, by way of example only, with reference to the annexed figures, wherein.

DETAILED DESCRIPTION

Figure 1:
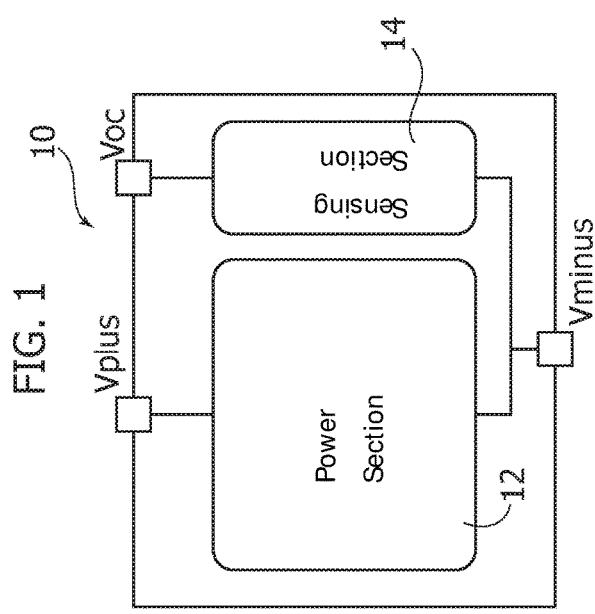
FIG. 1 is a functional block diagram exemplary of a possible system architecture including embodiments.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

As discussed previously, tracking the point of operation of a system, e.g. with the aim of pursuing a maximum power point, is a desirable feature in energy harvesting systems.

In power generation systems (e.g. photovoltaic, kinetic or thermoelectric systems) energy transfer may reach a "best" energy transfer point leading to a highest (maximum) power generation point.

The ability to adjust (quickly and precisely) the electrical operation point of the system to maximize power generation thus represent a desirable feature.

Various maximum power point tracking (MPPT) solutions have been devised over the years based on various strategies, comprising e.g.: constant voltage, open circuit voltage, short circuit voltage, perturb and observe, incremental conductance, temperature, and temperature parametric.

These methods have advantages and disadvantages.

For instance, a constant voltage approach may represent a sensible choice due to its simplicity and the possibility of providing advantages such as: measurement of one parameter (only), reduced numerical computation requirements, absence of steady-state oscillations, and low-power consumption.

The last mentioned advantage may be significant, e.g. in (ultra) low-power applications where the (very) small amounts of energy available may not justify implementing MPPT insofar as the energy taken to implement that function is hardly compensated by (and may even be bigger than) the energy saved.

This remark suggests that a MPPT circuit for (ultra) low-power energy harvesting should desirably be as simple as possible, so that the energy absorbed may be reduced to a level low enough to achieve a positive balance between energy saved and energy taken in performing a MPPT function.

In various energy-generating systems (such as photovoltaic (PV) cells, kinetic energy generators with piezoelectric elements (PZE) or thermoelectric generators (TEG)), a MPPT function may involve measuring of an open circuit voltage Voc as discussed in the following.

In the case of PV cells, the power delivered may depend on various factors such as irradiance, temperature and the current drawn from the cell. In a PV cell, the relationship between voltage and current essentially follows a logarithmic law.

The output power of a PV cell is known to reach a highest (maximum) level at a voltage Vmp which is related to the open-circuit voltage Voc of the PV cell by a relationship such as Vmp=k*Voc, with the value for k lying between 0.7 and 0.8.

In the case of a kinetic harvester, such as a piezoelectric (PZE) cantilever, energy transfer (e.g., the optimum energy transfer point) may depend on the frequency at which the harvester vibrates.

For instance, the output power provided by a PZE cantilever may be expressed as:

$$P=2*\pi*C*Vout*(Voc-Vout)*f,$$

where: C is the internal plate capacitor of the piezoelectric material, Vout is the output voltage when the generator is loaded, Voc is the open circuit output voltage, and f is the inherent resonant frequency.

The output power versus output voltage relationship exhibits a substantially (inverted) parabolic trend with a peak value at Vout=Voc/2.

This suggests that, in order to facilitate achieving an optimum power transfer, the PZE cell should desirably be conditioned in order to operate within a voltage range arranged in the vicinity of Voc/2.

Also in that case the knowledge of the open voltage output value (Voc) may be helpful.

It is noted that the shape of the parabola changes with the frequency at which the PZE cell is stimulated.

For that reason if the PZE cell is stimulated at (very) different speeds, the capability of tracking the voltage Voc may be helpful to facilitate optimum power efficiency or achieving MPPT.

Thermoelectric generators (TEG) convert heat energy into electricity in an amount which may depend on the temperature difference across them and the electrical load applied.

In the case of thermoelectric generators the output power Pout can be expressed with a relationship such as:

$$Pout=(-Vout^2+Vout*Voc)/Rteg$$

where, again, Voc is the open-circuit output voltage of the generator and Rteg is the internal electric resistance of the generator.

Also in this case, the relationship of the output power provided by the generator versus the output voltage relationship is an (inverted) parabola having maximum at the output voltage Vout=Voc/2.

To sum up, irrespective of the specific type of generator considered, it is generally recognized that the open-circuit voltage method may have a disadvantage in that measuring the Voc voltage involves opening the circuit between the energy harvester and the power converter and sampling the voltage after the circuit has been opened.

As a result, no energy flows from the energy "scavenger" (that is the circuit used for measuring the open-circuit voltage) to the converter while the voltage Voc is sampled because the converter is disconnected, which may be for a time interval long enough to permit the input capacitance of the converter to be charged up to the voltage Voc.

In (ultra) low-power applications, the current delivered by the harvester is very low and the storage capacitor may have a value of, e.g. hundreds of µF: meeting with load RMS requirements may thus involve (very) slow operation and could take a time of the order of several milliseconds.

Another disadvantage may lie in an additional series switch used in order to disconnect the energy harvester from the converter. Using such a switch may involve providing a high-side gate driver with continuous conduction time for fairly long periods: this may introduce additional energy losses when the switch is closed.

A further disadvantage may lie in circuit complexity, insofar as the sampling activity may involve using a digital circuit and a fairly complex algorithm implemented, e.g., via a microcontroller. This may (further) increase circuit complexity with possible additional power losses.

One or more embodiments may provide an open-circuit measurement arrangement which can operate (also) during normal (switching) operation of the converter so that reduction in harvesting efficiency may be negligible.

According to an exemplary architecture as presented in FIG. 1, one or more embodiments may include device 10 including two sections, namely:

- a power section 12, essentially corresponding to a conventional (e.g. photovoltaic, PV, generator) providing an output voltage between two nodes Vplus and Vminus, and
- a Voc (open circuit voltage) sensing section 14; this may correspond to a sort of "miniaturized" scaled-down replica of the power section 12 and provide a Voc voltage (e.g., referred to Vminus) at a corresponding output node.

In one or more embodiments, the power section 12 may take the higher percentage of the volume/area of the whole device 10 and act as the energy generator/provider proper.

The sensing section 14 may be a sort of a reduced (scaled down, for example) version of the power section 12 devoted to measuring the voltage Voc.

In operation, the sensing section 14 will be loaded lightly and/or provide a (much) lower power than the power section 12.

Consequently, the volume/area of the sensing section 14 will be (much) smaller and almost negligible with respect to the volume/area of the power section 12.

For instance, a scaling-down factor (scale) of at least 10 and optionally at least 100 may be exemplary of values which may facilitate achieving such a result.

By way of example, in the case of a PV harvester, the sensing section 14 may be designed in such a way to be able to provide a current of, e.g., between 5 nA and 10 nA without an appreciable drop in Voc in currently expected operating conditions, with the Voc terminal (see e.g. FIG. 1) capable of providing a current of the order of, say, 50 nA to 100 nA (worst case).

In the case of a power section 12 dimensioned to provide 1 µA, this would result in a 1/10 area ratio, that is a scaling factor equal to 10.

In the case of a power section 12 dimensioned to provide 10 µA, this would result in a 1/100 area ratio, that is a scaling factor equal to 100.

In one or more embodiments, the ratio of the volume/area of the sensing section 14 to the volume/area of the power section 12 will be the (only) source of power inefficiency of the arrangement.

With a proper design of the device 10, this inefficiency can be reduced to a minimum, (well) below the level of inefficiency of conventional solutions.

In an arrangement as exemplified in FIG. 1 the device 10 will have three terminals or nodes, namely Vplus, Vminus and Voc, in comparison with—only—two terminals as possibly present in certain conventional arrangements.

This may be regarded as an apparent drawback, which however was found to be (largely) compensated by various advantages.

A first advantage may be an increased simplicity of the DC-DC converter. In one or more embodiments, such a converter may involve (only) an additional simple and (ultra) low-power comparator to perform the MPPT function. This will result in reduced circuit complexity related, e.g., to the possibility of dispensing with complex logic circuitry, algorithms and microcontrollers.

Another advantage may lie in improved energy efficiency achieved via reduced energy losses, e.g., due to series switches being dispensed with along with the associated I²Ron losses.

A further increase in energy efficiency may derive from the continuous flow of energy from the device 10 to the converter, e.g., due to the possibility of avoiding disconnection in order to measure the Voc voltage.

Also, the possibility of reducing the size of the system as a whole (system miniaturization) will have a synergistic effect insofar as the additional volume/area taken by the device 14 will be (largely) compensated by the increase in energy efficiency.

Also, a possible simplified architecture of the DC-DC converter may facilitate adopting a low-cost architecture thus making it advantageous to apply MPPT also to (ultra) low-power applications.

Figure 2:
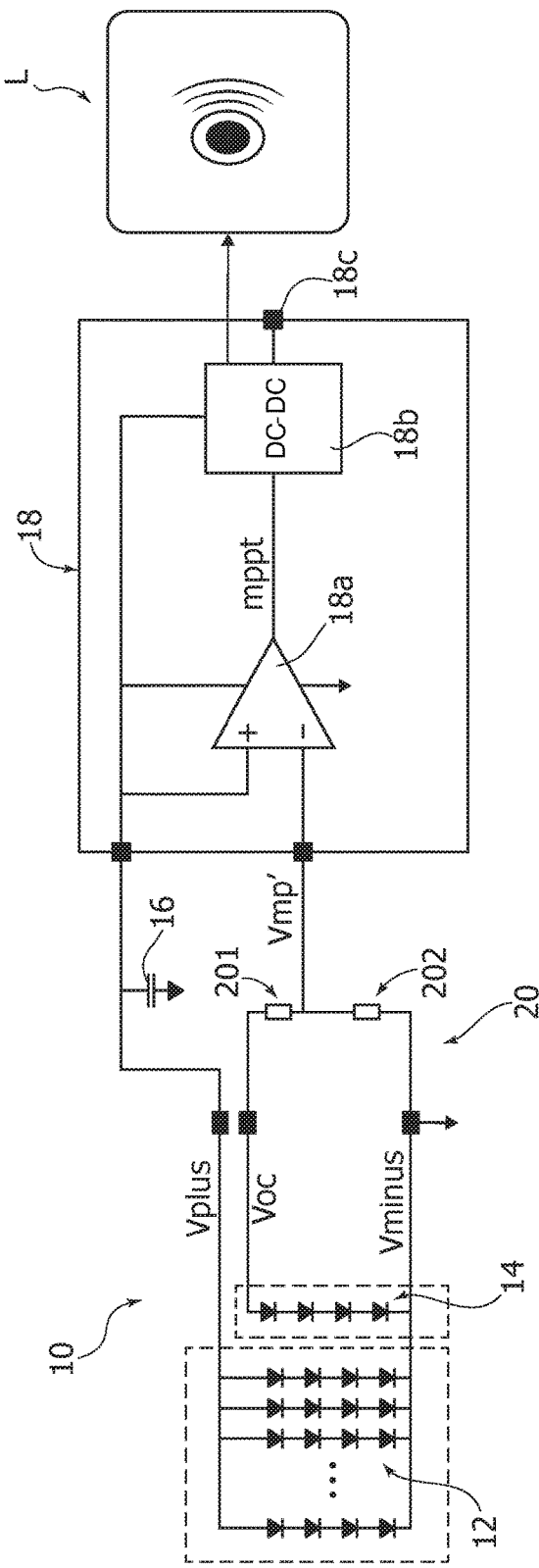
FIG. 2 is a block diagram exemplary of embodiments.

The circuit diagram of FIG. 2 is representative of an application referred—merely by way of example—to a photovoltaic (PV) cell 10 including, e.g.:

a main, "large" array 12 of photovoltaic generators—of any known type, an ancillary, "small" array 14 of photovoltaic generators—again of any known type, optionally but not necessarily of the same type of the PV generators in the main array 12.

The array 14 may thus provide a scaled-down replica array of the array 12, with the array 14 associated with circuitry configured to sense the open-circuit voltage Voc as discussed previously.

It will be otherwise appreciated that one or more embodiments can be applied to other "scavenger" devices by relying on the functional dependency of the maximum power point on Voc as discussed previously for PV generators (discussed herein by way of example), kinetic generators (such as PZE) or thermoelectric generators (TEG).

For instance, in an exemplary embodiment as presented in FIG. 2 (wherein a PV generator is exemplified for simplicity), the Vplus terminal of the "main" PV cell 12 may provide energy to a storage element such as a capacitor 16.

Figure 3:
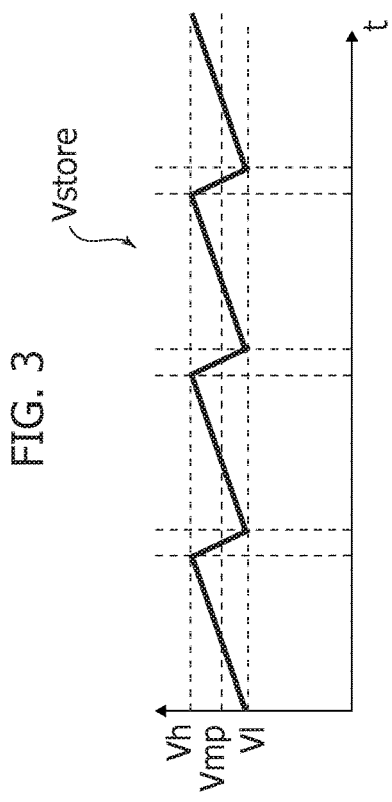
FIG. 3 is exemplary of a possible time behavior of a signal in embodiments.

In a steady-state condition, the voltage Vstore stored on the element 16 may toggle between two voltages Vh and Vl as exemplified in FIG. 3.

For instance, as a result of Vstore reaching an (upper) voltage Vh, a transfer mechanism of the energy stored at 16 can be activated towards a load L (see the right-hand side of FIG. 2), which per se may be distinct from the embodiments, e.g. an IoT node, with the load L coupled to an output node 18c of the converter 18b.

In an exemplary embodiment as presented in FIG. 2, energy transfer towards the load L may be, e.g., via a DC-DC converter 18b (which per se may be of a conventional, simplified design) controlled via a signal mppt from a comparator 18a as discussed in the following.

As a result of energy being transferred to the load, the voltage Vstore will drop from an upper value Vh (see again the diagram of FIG. 3) to a lower value Vl, with the DC-DC converter 18b turned off (energy transfer discontinued), thereby facilitating renewed storage of energy on the element 16 until the upper value Vh is reached again.

In one or more embodiments, the drop from Vh to Vl may be limited, e.g. in such a way that the average of Vstore will "track" an desired voltage for MDPT, namely Vmp.

For instance, for a given PV cell 12, Vh and Vl can be selected so that Vmp=(Vh+Vl)/2, with the differences Vh−Vmp and Vmp−Vl selected in such a way that power loss with respect to the highest value is maintained within a desired range (e.g. 90%).

It is noted that the voltage Vmp in the power cell 12 may vary over time depending on the operating conditions such as light intensity and temperature.

As noted, a certain relationship may exist between Vmp and Voc, the open circuit voltage (e.g., Vmp=k*Voc, with k between 0.7 and 0.8) and a value for the voltage Voc can be obtained via the replica circuit/array 14.

For instance, a resistive voltage divider 20 can be provided coupled across the replica circuit 14 (e.g., between Voc and Vminus) and including resistors 201 and 202 with values Rup and Rdn.

The voltage at the tap point of the voltage divider 201, 202 may provide a scaled version Vmp' of the voltage Voc, e.g., with a scaling factor which is given by the dividing factor or ratio of the voltage divider, namely Rdn/(Rup+Rdn) with that ratio lying, e.g., between 0.7-0.8 so that Vmp' will provide a good approximation of Vmp (being notionally identical thereto).

In one or more embodiments a simple (low-cost) ultra low-power comparator 18a (e.g. coupled to the DC-DC converter 18b) may condition the voltage stored at 16 (e.g. by controlling the toggling cycles as exemplified in FIG. 3) in order to facilitate its average to track the Vmp voltage in various environmental conditions, e.g., via a circuit block 18b possibly integrated in the converter 18.

Figure 4:
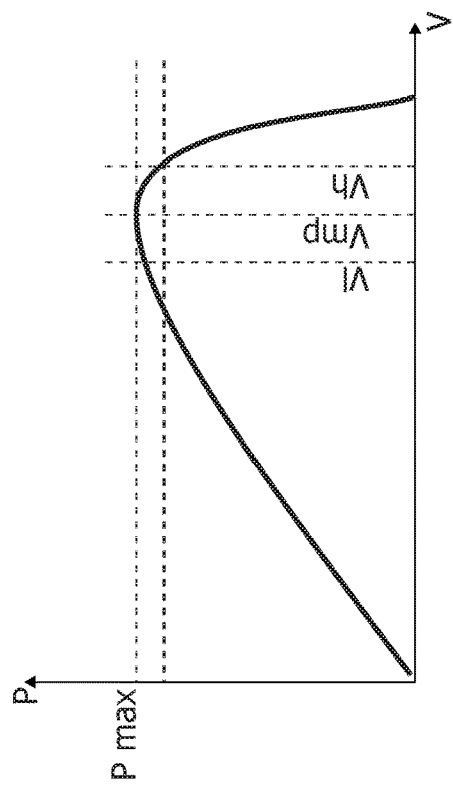

For instance, FIG. 4 is diagram exemplary of the relationship between the output power P and the output voltage V of a PV generator. As noted previously, other types of energy harvesters (e.g., PZE, TEG) may exhibit a similar relationship (e.g., inverted parabolic with a maximum value at Voc/2).

The relationship exemplified in FIG. 4 exhibits a peak value Pmax for the output power at a voltage Vmp, so that the "toggling" operation of the converter 18b between Vl and Vm as discussed in connection with FIG. 3 may facilitate avoiding that the output power may drop below, e.g. 90% of the peak value Vmp*Imp. For instance, as discussed previously, for a given PV cell, e.g., the cell 12, Vh and Vl can be selected so that Vmp=(Vh+Vl)/2, with the differences Vh−Vmp and Vmp−Vl selected in such a way that power loss with respect to the highest value is maintained within a desired range (e.g. 90%).

As noted, the voltage Vmp in a power cell such as 12 may vary over time depending on the operating conditions such as light intensity and temperature.

Adequate operation of the cell may thus involve selectively varying Vh+Vl in such a way as to "track" such operating conditions by keeping Vh+Vl around Vmp, with, e.g., Vmp=(Vh+Vl)/2.

Figure 5:
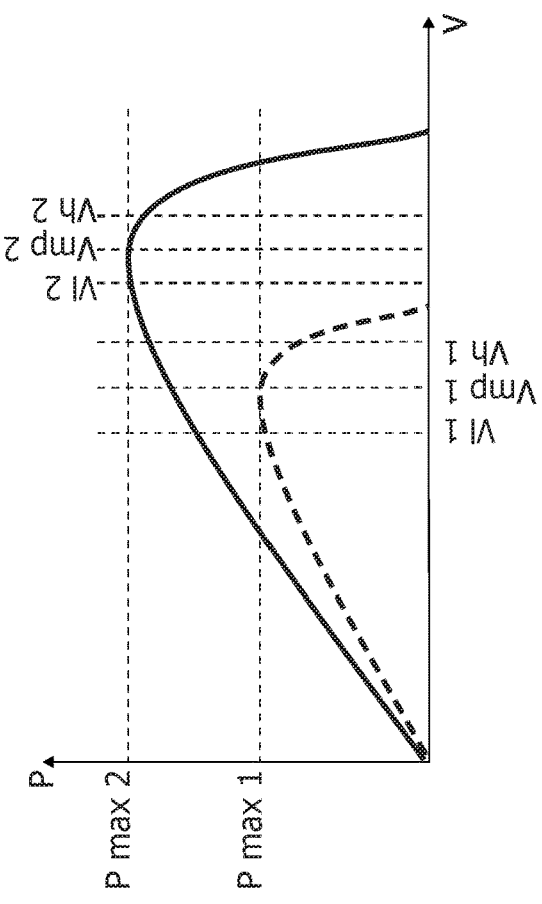
FIGS. 4 and 5 are diagrams exemplary of possible operation of embodiments.

The diagram of FIG. 5 relates to different operating conditions of a—virtually identical—PV cell such as 12, in, e.g., outdoor operation (continuous line) and indoor operation (dashed line).

In one or more embodiments, a measure (at least approximate) of Voc (and thus of Vmp), will be provided by the output Vmp' from the divider 20 associated with the small-scale "replica" array 14 based on the relationship between Vmp and Voc, e.g. Vmp=k*Voc, with k between 0.7 and 0.8).

This will facilitate driving the converter 18b (e.g. via the comparator 18a) in such a way that, e.g.:

in the first operating conditions (e.g., indoor operation) first values for Vh and Vl may be adopted, e.g. Vh1 and Vl1, in order to keep Vh1 and Vl1 around a first value for Vmp, that is Vmp1, e.g., with Vmp1=(Vh1+Vl1)/2 to maintain the output power from the cell 12 around the peak value Pmax1=Vmp1*Imp1 which the cell can generate in those first operating conditions;

in the second operating conditions (e.g., outdoor operation) second values for Vh and Vl may be adopted, e.g. Vh2 and Vl2, in order to keep Vh2 and Vl2 around a second value for Vmp, that is Vmp2, e.g., with Vmp2=(Vh2+Vl2)/2 to maintain the output power from the cell 12 around the peak value Pmax2=Vmp2*Imp2 which the cell can generate in those second operating conditions.

In one or more embodiments the values for Vh and Vl may self-adapt to the various power generation conditions which may vary dynamically with the ambient conditions.

In one or more embodiments, this type of operation (see again the toggling behavior exemplified in FIG. 3) may be implemented by using a hysteresis comparator 18a which changes state at the upper end and lower end of an interval ΔV set around Vmp (e.g. an interval (Vmp−ΔV/2; Vmp+ΔV/2) centered at Vmp), with these upper/lower ends or bounds corresponding to Vh and Vl.

A circuit (e.g., 10) according to one or more embodiments may comprise:
- a first generator (e.g., 12) configured to produce a first (electrical) signal (e.g., Vplus, Vminus),
- an energy storage circuit (e.g., 16) coupled to the first generator and supplied with the first signal therefrom,
- energy transfer circuitry (e.g., a DC-DC converter such as exemplified at 18b) coupled to the energy storage circuit and configured to transfer towards an output node (e.g., 18c) energy stored in the energy storage circuit,
- driver circuitry (e.g., 18a) coupled to the energy transfer circuitry, the driver circuitry configured to controllably switch (see e.g. the toggling behavior in FIG. 3) the energy transfer circuitry between an energy storage state of the first signal from the first generator in the energy storage circuit and an energy transfer state of the energy stored in the energy storage circuit towards the output node, the voltage (e.g., Vstore in FIG. 3) at the energy storage circuit alternatively variable between an upper value (e.g., Vh) and a lower value (e.g., Vl) around a voltage setting point (e.g. Vmp), and
- a second generator (e.g., 14) comprising a down-scaled replica of the first generator (e.g. in the vicinity of the first generator 12), the second generator configured (e.g., 20) to produce a second (electrical) signal (e.g. Vmp', as a function of Voc) indicative (e.g. a function such as a proportional function) of the open-circuit voltage (e.g. Voc) of the first generator, the second generator coupled to the driver circuitry of the energy transfer circuitry, wherein the driver circuitry of the energy transfer circuitry is sensitive (e.g. at the inverting input of the comparator 18a) to the second signal from the second generator, with said voltage setting point set as a function of the second signal from the second generator indicative of the open-circuit voltage of the first generator.

One or more embodiments may comprise a voltage divider (e.g., 20, 201, 202) coupled to the second generator and to the driver circuitry of the energy transfer circuitry with an output voltage from the voltage divider coupled to the driver circuitry of the energy transfer circuitry.

In one or more embodiments, the driver circuitry of the energy transfer circuitry may comprises a comparator (e.g., 18a) coupled to the energy storage circuit section and to the second generator, the comparator sensitive (e.g. at the non-inverting input) to the voltage at the energy storage circuit section and to the second signal (e.g., Vmp') from the second generator.

In one or more embodiments, the comparator may comprise a hysteresis comparator configured to change state at an upper end (e.g., Vmp+ΔV/2) and a lower end (e.g., Vmp−ΔV/2) of a hysteresis interval (e.g. ΔV) around said voltage setting point.

In one or more embodiments, the second generator may comprise a down-scaled replica of the first generator with a scaling factor of at least 10, optionally at least 100.

In one or more embodiments, the first and the second generator may comprise photovoltaic generators.

A system according to one or more embodiments may comprise: at least one circuit as described above and an electrical load (e.g. L,) coupled to the output node of the circuit to be supplied thereby.

According to one or more embodiments a method comprises:
- producing a first (electrical) signal via a first generator;
- providing an energy storage circuit coupled to the first generator and supplied with the first signal therefrom;
- transferring energy stored in the energy storage circuit towards an output node via energy transfer circuitry controllably switched between an energy storage state of the first signal from the first generator in the energy storage circuit and an energy transfer state of the energy stored in the energy storage circuit towards the output node, wherein the voltage at the energy storage circuit section alternatively varies between an upper value and a lower value around a voltage setting point,
- producing a second (electrical) signal via a second generator comprising a down-scaled replica of the first generator, the second signal indicative (e.g. a function such as a proportional function) of the open-circuit voltage of the first generator, and
- setting said voltage setting point as a function of the second signal from the second generator indicative of the open-circuit voltage of the first generator.

Without prejudice to the underlying principles, the details and embodiments may vary, even significantly, with respect to what has been described herein merely by way of example without departing from the extent of protection.

The extent of protection is determined by the annexed claims.

The invention claimed is:

1. A circuit, comprising:
    a photovoltaic generator comprising a first array of photovoltaic cells connected between a first supply node and a ground node and a second array of photovoltaic cells connected between a second supply node and the ground node;
    an energy storage capacitor having a first terminal connected to the first supply node and a second terminal connected to the ground node;
    a resistive divider circuit connected between the second supply node and the ground node, said resistive divider circuit having a tap node;
    a comparator having a first input directly connected to the first terminal of the energy storage capacitor and a second input directly connected to the tap node; and
    a DC-DC converter circuit having a supply input directly connected to the first terminal of the energy storage capacitor and a control input connected to receive a control signal output from the comparator, said control signal the switching the DC-DC converter circuit between a first state where energy from the first supply node is stored in the energy storage capacitor and a second state where energy from the first supply node is transferred towards an output node.

2. The circuit of claim 1, wherein the comparator is a hysteresis comparator, with the hysteresis setting an upper value and a lower value for switching the first and second states around a voltage setting point that is set by a voltage generated at the tap node.

3. The circuit of claim 1, wherein a voltage generated by the second array of photovoltaic cells at the second supply node is electrically independent of a voltage generated by the first array of photovoltaic cells at the first supply node.

4. The circuit of claim 1, wherein the second supply node is electrically isolated from the first supply node.

5. The circuit of claim 1, wherein a voltage at the first input of the comparator is dependent solely on a voltage generated by the first array of photovoltaic cells at the first supply node and wherein a voltage at the second input of the comparator is dependent solely on voltage generated by the second array of photovoltaic cells at the second supply node.

6. A circuit, comprising:
an energy generator comprising a power portion configured to produce a supply voltage at a first supply node in response to an external stimulus and a replica portion configured to produce an open circuit voltage at a second supply node in response to the same external stimulus;
an energy storage capacitor having a first terminal connected to the first supply node and a second terminal connected to a ground node;
a resistive divider circuit connected between the second supply node and the ground node, said resistive divider circuit having a tap node;
a comparator having a first input directly connected to the first terminal of the energy storage capacitor and a second input directly connected to the tap node; and
a DC-DC converter circuit having a supply input directly connected to the first terminal of the energy storage capacitor and a control input connected to receive a control signal output from the comparator, said control signal the switching the DC-DC converter circuit between a first state where energy from the first supply node is stored in the energy storage capacitor and a second state where energy from the first supply node is transferred towards an output node.

7. The circuit of claim 6, wherein the energy generator is a photovoltaic generator and said power portion comprises a first array of photovoltaic cells and said replica portion comprises a second array of photovoltaic cells.

8. The circuit of claim 6, wherein the energy generator is a kinetic energy generator and said power portion comprises first piezoelectric elements and said replica portion comprises second piezoelectric elements.

9. The circuit of claim 6, wherein the energy generator is a thermoelectric generator and said power portion comprises first thermoelectric elements and said replica portion comprises second thermoelectric elements.

10. The circuit of claim 6, wherein the comparator is a hysteresis comparator, with the hysteresis setting an upper value and a lower value for switching the first and second states around a voltage setting point that is set at the tap node from the open circuit voltage.

11. The circuit of claim 6, wherein the open circuit voltage at the second supply node is electrically independent of the supply voltage at the first supply node.

12. The circuit of claim 6, wherein the second supply node is electrically isolated from the first supply node.

13. The circuit of claim 6, wherein a voltage at the first input of the comparator is dependent solely on the supply voltage at the first supply node and wherein a voltage at the second input of the comparator is dependent solely on the open circuit voltage at the second supply node.

14. A circuit, comprising:
a first generator configured to produce a power supply voltage;
a second generator comprising a down-scaled replica of the first generator, the second generator configured to produce an open-circuit voltage of the first generator;
an energy storage circuit coupled to receive the power supply voltage from the first generator, wherein voltage at the energy storage circuit is alternatively variable between an upper value and a lower value around a voltage setting point;
an energy transfer circuit having a supply input coupled to the energy storage circuit and having control input configured to receive a control signal for controlling transfer of energy stored in the energy storage circuit section towards an output node;
a comparator circuit coupled to the first and second generators and configured to compare the power supply voltage to a voltage derived from the open-circuit voltage in order to generate the control signal, wherein the control signal controls switching of the energy transfer circuit between a first state where energy of the power supply voltage is stored in the energy storage circuit and a second state where energy stored in the energy storage circuit is transferred towards the output node.

15. The circuit of claim 14, wherein the upper and lower values are determined by a hysteresis of the comparator circuit and wherein the voltage setting point is set by the voltage derived from the open-circuit voltage.

16. The circuit of claim 14, further comprising a voltage divider coupled to the second generator and configured to generate the voltage derived from the open-circuit voltage.

17. The circuit of claim 14, wherein the comparator comprises a hysteresis comparator configured to change state at an upper end and a lower end of a hysteresis interval around said voltage setting point.

18. The circuit of claim 14, wherein the second generator comprises a down-scaled replica of the first generator with a scaling factor of at least 10.

19. The circuit of claim 14, wherein the second generator comprises a down-scaled replica of the first generator with a scaling factor of at least 100.

20. The circuit of claim 14, wherein the first generator and the second generator comprise photovoltaic generators.

21. The circuit of claim 14, wherein the first generator and the second generator comprise kinetic energy generators.

22. The circuit of claim 14, wherein the first generator and the second generator comprise thermoelectric generators.

* * * * *

UNITED STATES PATENT AND TRADEMARK OFFICE
CERTIFICATE OF CORRECTION

PATENT NO. : 11,169,556 B2  
APPLICATION NO. : 16/283067  
DATED : November 9, 2021  
INVENTOR(S) : Roberto La Rosa Page 1 of 1

It is certified that error appears in the above-identified patent and that said Letters Patent is hereby corrected as shown below:

In the Specification

At Column 7, Line 47, replace [[ MDPT ]] with – MPPT –.

Signed and Sealed this
Twenty-seventh Day of August, 2024

Katherine Kelly Vidal
*Director of the United States Patent and Trademark Office*